(12) United States Patent
Park et al.

(10) Patent No.: US 9,601,520 B2
(45) Date of Patent: Mar. 21, 2017

(54) THIN FILM TRANSISTOR ARRAY PANEL AND DISPLAY DEVICE INCLUDING THE SAME

(75) Inventors: Joon Yong Park, Gunpo-si (KR); Chang Oh Jeong, Suwon-si (KR); Byeong Beom Kim, Asan-si (KR); Hong Long Ning, Suwon-si (KR); Hyung Jun Kim, Yongin-si (KR); Sang Won Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 513 days.

(21) Appl. No.: 13/597,940

(22) Filed: Aug. 29, 2012

(65) Prior Publication Data
US 2013/0293524 A1 Nov. 7, 2013

(30) Foreign Application Priority Data

May 7, 2012 (KR) .................. 10-2012-0048265

(51) Int. Cl.
*H01L 27/12* (2006.01)
*H01L 29/45* (2006.01)
*G02F 1/1345* (2006.01)

(52) U.S. Cl.
CPC .......... *H01L 27/124* (2013.01); *H01L 29/458* (2013.01); *G02F 1/13458* (2013.01); *G02F 2202/16* (2013.01)

(58) Field of Classification Search
CPC .................................. G02F 1/13458
See application file for complete search history.

(56) References Cited

U.S. PATENT DOCUMENTS

| 6,897,933 | B2 | 5/2005 | Hoshina | |
|---|---|---|---|---|
| 7,599,038 | B2 | 10/2009 | Oda | |
| 7,889,298 | B2 | 2/2011 | Umeno et al. | |
| 2004/0252267 | A1* | 12/2004 | Ma et al. | 349/139 |
| 2005/0041192 | A1 | 2/2005 | Kuo et al. | |
| 2008/0173870 | A1* | 7/2008 | Kim et al. | 257/59 |
| 2011/0317085 | A1* | 12/2011 | Wang et al. | 349/39 |

FOREIGN PATENT DOCUMENTS

| JP | 08-297291 | 11/1996 |
|---|---|---|
| JP | 09-152623 | 6/1997 |
| JP | 2005-266683 | 9/2005 |
| KR | 10-0197074 | 11/1997 |
| KR | 10-0229610 | 9/1998 |

* cited by examiner

*Primary Examiner* — Jessica M Merlin
(74) *Attorney, Agent, or Firm* — H.C. Park & Associates, PLC

(57) ABSTRACT

Exemplary embodiments of the present invention relate to a panel and a display device including the same, the panel including a substrate, a signal line arranged on the substrate, the signal line configured to transmit a driving signal, an insulating layer arranged on the signal line, and a pixel electrode and a contact assistant arranged on the insulating layer. The contact assistant is electrically connected to a portion of the signal line, the contact assistant includes indium zinc oxide doped with a metal oxide not including indium or zinc, and the metal oxide has a smaller Gibbs free energy than zinc oxide.

24 Claims, 8 Drawing Sheets

THIN FILM TRANSISTOR ARRAY PANEL AND DISPLAY DEVICE INCLUDING THE SAME

CROSS-REFERENCE TO RELATED APPLICATION

This application claims priority to and the benefit of Korean Patent Application No. 10-2012-0048265, filed on May 7, 2012, which is hereby incorporated by reference for all purposes as if fully set forth herein.

BACKGROUND

Field

The present invention relates to a thin film transistor array panel and a display device including the same.

Discussion of the Background

A display device may include a liquid crystal display, an organic light emitting display device, or an electrophoretic display.

Such a display device may include a plurality of pixels and a plurality of display signal lines. Each pixel may include a switching element and a pixel electrode connected thereto, and the switching element may be connected to the display signal line. The display signal line may include a gate line for transmitting a gate signal and a data line for transmitting a data voltage. The pixel electrode may receive the data voltage according to the gate signal through the switching element. The gate signal may be generated from a gate driver according to a control of the signal controller and output to a plurality of gate lines, and the data signal may be obtained by receiving a digital image signal from a signal controller through a data driver and converting it into a data voltage.

The pixel electrodes and switching elements may be formed in a thin film transistor array panel. A signal controller may be generally provided on a printed circuit board (PCB) positioned outside the thin film transistor array panel. Also, the gate driver or the data driver may be installed directly on the thin film transistor array panel in a form of at least one integrated circuit chip (i.e., chip on glass (COG)), may be mounted on a flexible printed circuit film (FPC), or may be attached to the thin film transistor array panel in a form of a tape carrier package (TCP) (i.e., chip on FPC (COF)). In the case of the COF, the flexible printed circuit film may be positioned between the printed circuit board (PCB) and the thin film transistor array panel.

An integrated circuit (IC) chip directly mounted on the thin film transistor array panel and the TCP including the driver may contact a pad part of the display signal lines formed on the thin film transistor array panel, however when contact resistance of the pad part is high, the gate signal or the data signal transmitted to the thin film transistor array panel may be distorted such that the thin film transistor may not be normally operated. Also, the manufacturing time and cost may be increased or the yield may be decreased according to the material of the pad part.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention relate to a thin film transistor array panel and a display device that may have reduced contact resistance and increased productivity.

Additional features of the invention will be set forth in the description which follows, and in part will be apparent from the description, or may be learned by practice of the invention.

An exemplary embodiment of the present invention discloses a panel including a substrate, a signal line arranged on the substrate, the signal line configured to transmit a driving signal, an insulating layer arranged on the signal line, and a pixel electrode and a contact assistant arranged on the insulating layer. The contact assistant is electrically connected to a portion of the signal line, the contact assistant includes indium zinc oxide (IZO) doped with a metal oxide not including indium (In) or zinc (Zn), and the metal oxide has a smaller Gibbs free energy than zinc oxide (ZnO).

An exemplary embodiment of the present invention also discloses a display device including a substrate, a signal line arranged on the substrate, the signal line configured to transmit a driving signal, an insulating layer arranged on the signal line, a pixel electrode and a contact assistant arranged on the insulating layer, and a driver contacting the contact assistant. The contact assistant is electrically connected to a portion of the signal line, the contact assistant includes indium zinc oxide (IZO) doped with a metal oxide not including indium (In) or zinc (Zn), and the metal oxide has a smaller Gibbs free energy than zinc oxide (ZnO).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
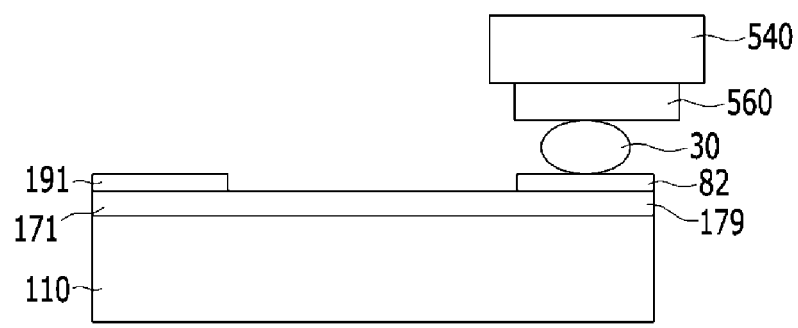
FIG. 1 is a cross-sectional view of a thin film transistor array panel according to an exemplary embodiment of the present invention.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

First, a thin film transistor array panel according to an exemplary embodiment of the present invention will be described with reference to FIG. 1 and FIG. 2.

Figure 2:
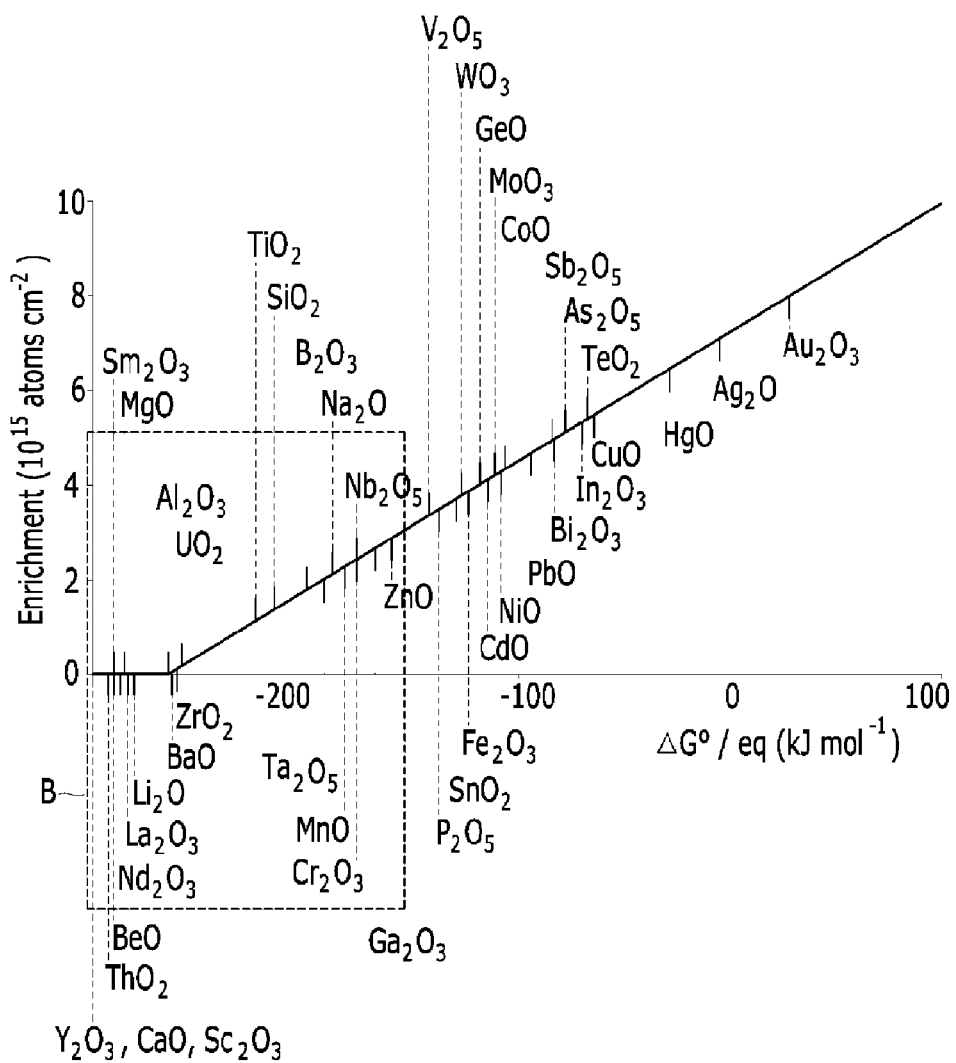
FIG. 2 is a graph showing an example of a material included a pad portion of a thin film transistor array panel according to an exemplary embodiment of the present invention.

FIG. 1 is a cross-sectional view of a thin film transistor array panel according to an exemplary embodiment of the present invention, and FIG. 2 is a graph showing an example of a material included in a pad portion of a thin film transistor array panel according to an exemplary embodiment of the present invention.

Referring to FIG. 1, a thin film transistor array panel according to an exemplary embodiment of the present invention includes contact assistants (also referred to as "a pad portion") 82 positioned on an insulation substrate 110.

The contact assistants 82 include indium zinc oxide (IZO) doped with a metal oxide.

In detail, a plurality of signal lines for transmitting a driving signal such as a gate signal and a data signal are positioned on the insulation substrate 110, which may be made of an insulating material such as glass or plastic. FIG. 1 shows the data line 171 for transmitting the data voltage as the signal line.

Each data line 171 includes an end portion 179 for connection to drivers or other constituent elements.

The data line 171 may be made of a material such as aluminum (Al) or an aluminum alloy, silver (Ag) or a silver alloy, a copper (Cu) or a copper alloy, a molybdenum (Mo) or a molybdenum alloy, chromium (Cr), tantalum (Ta), and titanium (Ti). For example, a molybdenum alloy includes Mo—Nb and Mo—Ti. Also, the data line 171 may be made of a transparent conductive material such as indium tin oxide (ITO), IZO, and aluminum zinc oxide (AZO). The data line 171 may be made of a multilayer structure including at least two conductive layers (not shown). For example, the data line 171 may be made of a triple layer structure or a dual-layer structure such as Mo/Al/Mo, Mo/Al, Mo/Cu, Cu/Mn/Cu, and Ti/Cu.

A passivation layer (not shown) made of an insulating material may be positioned on the data line 171, and a plurality of pixel electrodes 191 and a plurality of contact assistants 82 are formed on the passivation layer.

The pixel electrode 191 may display images through an optical conversion means (e.g., a liquid crystal layer or an organic emission layer) by receiving the data voltage. The pixel electrode 191 may be connected to an underlying conductive layer through a contact hole (not shown) formed in the passivation layer. For example, the pixel electrode 191 may be connected to a drain electrode (not shown) positioned with the same layer as the data line 171 and forming a thin film transistor along with a source electrode (not shown) of the data line 171, thereby receiving the data voltage.

The contact assistant 82 is connected to the end portion 179 of the data line 171. The contact assistant 82 may compensate adhesion between the end portion 179 of the data line 171 and an external device such as the driver, and protect them.

The pixel electrode 191 and the contact assistant 82 may include IZO doped with the metal oxide. The metal oxide doped to IZO may be at least one of $Ga_2O_3$, $Cr_2O_3$, MnO, $Ta_2O_5$, $SiO_2$, $TiO_2$, $ZrO_2$, BaO, $Li_2O$, $La_2O_3$, $Nd_2O_3$, BeO, $ThO_2$, $Y_2O_3$, CaO, $Sc_2O_3$, MgO, $Sm_2O_3$, $Al_2O_3$, $UO_2$, $B_2O_3$, $Na_2O$, and $Nb_2O_5$. The doped metal oxide does not include In or Zn.

The graph shown in FIG. 2 represents the Gibbs free energy of several metal oxides. Referring to FIG. 2, the metal oxides that may be doped to IZO are positioned in a region B, and are thermodynamically stable compared with zinc oxide (ZnO) and may have a smaller Gibbs free energy than ZnO.

As described above, the contact assistant 82 according to an exemplary embodiment of the present invention includes IZO such that the etching speed of the pixel electrode 191 and the contact assistant 82 may be fast compared to a case of forming the contact assistant with ITO, thereby reducing the manufacturing time, and defect particles caused by exposure to a plasma may not be generated such that the yield of the thin film transistor array panel is increased, thereby increasing productivity. Also, by forming the contact assistant 82 by doping a metal oxide to IZO that is thermodynamically stable compared with ZnO, a dangling bond on a surface of the contact assistant 82 including IZO may be decreased. That is, a dangling bond may include an impurity such as an —OH group. Accordingly, an oxidation reaction at the surface of the contact assistant 82 may be prevented such that contact resistance between the contact assistant 82 and the external device may be decreased, thereby preventing distortion of the driving signal.

Again referring to FIG. 1, an anisotropic conductive film (ACF) 30 is further positioned on the contact assistant 82 to contact the contact assistant 82. The anisotropic conductive film 30 may be formed by a method of coating a hard setting adhesive such as a resin on a flexible film such as PET with a conductive particulate dispersed therein. The anisotropic conductive film 30 with an adhesion film shape may have insulating properties in a direction parallel to the surface of the insulation substrate 110 and conductivity in a direction perpendicular to the surface of the insulation substrate 110.

A driver may be adhered to the contact assistant 82 of the thin film transistor array panel or the anisotropic conductive film 30. The driver may be attached directly to the contact assistant 82 or the anisotropic conductive film 30 in the shape of an IC chip or may be attached to a TCP such as a FPC film mounted with the IC chip or a PCB.

FIG. 1 is an example of the driver in which a data driving circuit 540 for transmitting the data signal to the data line 171 is adhered directly to the thin film transistor array panel in the shape of the IC chip. The data driving circuit 540 contacts the contact assistants 82 or the anisotropic conductive film 30, thereby including a bump 560 that transmits the data signal.

In the above-described exemplary embodiment, an example of the driving signal line is the data line, however it is not limited thereto and other signal lines and drivers, for example, may be equally applied to the gate line and the gate driver of the present invention.

Next, referring to FIG. 1 and FIG. 2, a manufacturing method of the thin film transistor array panel according to an exemplary embodiment of the present invention will be described.

Firstly, a conductive layer is deposited on an insulation substrate 110 by a sputtering method and is patterned to form a signal line such as the data line 171.

Next, after depositing an insulating material on the signal line (not shown), a conductive layer made of IZO doped with a metal oxide may be deposited by sputtering. The doped metal oxide does not include In or Zn. At this time, the metal oxide target for sputtering may include at least one of $Ga_2O_3$, $Cr_2O_3$, MnO, $Ta_2O_5$, $SiO_2$, $TiO_2$, $ZrO_2$, BaO, $Li_2O$, $La_2O_3$, $Nd_2O_3$, BeO, $ThO_2$, $Y_2O_3$, CaO, $Sc_2O_3$, MgO, $Sm_2O_3$, $Al_2O_3$, $UO_2$, $B_2O_3$, $Na_2O$, and $Nb_2O_5$ along with IZO. The sputtering may be performed at room temperature or at a high temperature of more than 150° C., for example.

Next, the conductive layer made of IZO doped with the non-In and non-Zn metal oxide is patterned by a wet etching method, as shown in FIG. 1, to form a plurality of pixel electrodes 191 and a contact assistant 82.

Next, an anisotropic conductive film 30 may be formed on the contact assistant 82.

According to an exemplary embodiment of the present invention, when forming the contact assistant 82, a defect particle may not be generated to the target for the sputtering even though the sputtering is performed at the high temperature, such that stripping of the conductive layer does not occur such that the yield may be improved. Also, the speed of wet etching the deposited conductive layer made of IZO and the metal oxide may be fast compared with ITO such that the manufacturing time may be reduced compared with the conventional art using ITO.

Next, a display device of a thin film transistor according to an exemplary embodiment of the present invention will be described with reference to FIG. 3.

Figure 3:
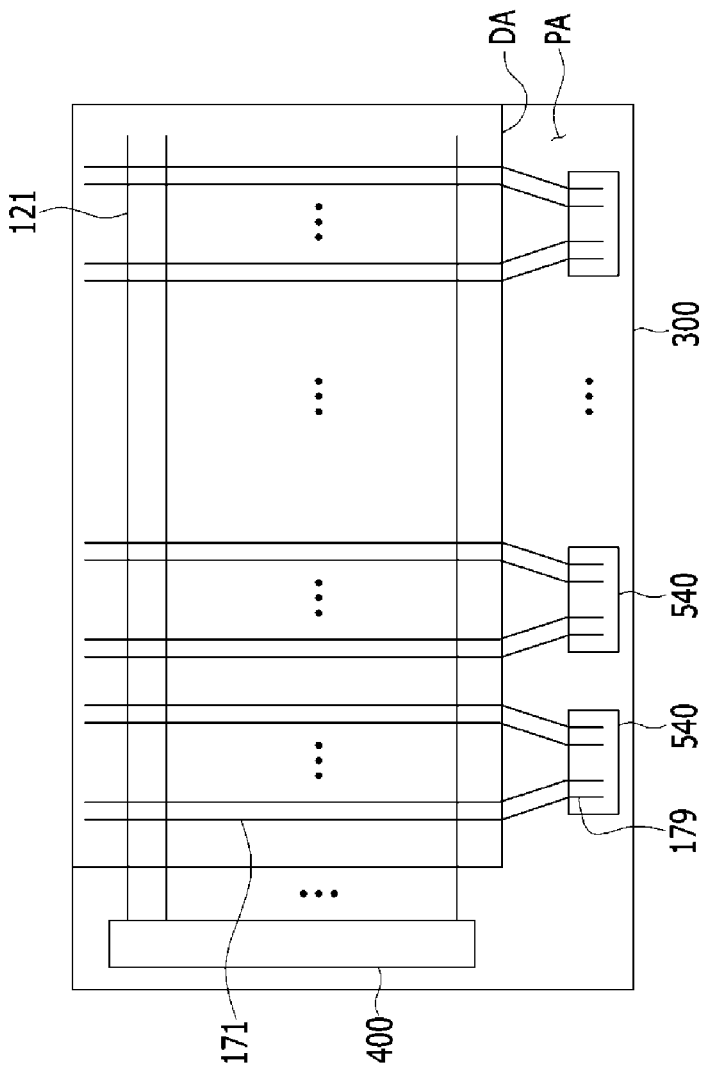
FIG. 3 is a layout view of a display device including a thin film transistor array panel according to an exemplary embodiment of the present invention.

FIG. 3 is a layout view of a display device of a thin film transistor array panel according to an exemplary embodiment of the present invention.

Referring to FIG. 3, the display device according to an exemplary embodiment of the present invention includes a thin film transistor array panel 300, a gate driver 400, and at least one data driving circuit 540.

The thin film transistor array panel 300 includes a display area (DA) displaying an image and a peripheral area (PA) surrounding thereto.

The display area DA includes a driving signal line and a plurality of pixels connected thereto and arranged in a matrix.

The driving signal line includes a plurality of gate lines 121 for transmitting a gate signal and a plurality of data lines 171 for transmitting a data voltage. The plurality of gate lines 121 extend in an approximate row direction and are parallel to each other, and the plurality of data lines 171 are parallel to each other and may cross the gate lines 121. Each data line 171 includes an end portion 179 for connection with an external device, and a contact assistant 82 is positioned thereon as shown in FIG. 1, and is electrically connected to the end portion 179 of the data line 171.

Each pixel may include a switching element such as a thin film transistor connected to the driving signal line, a pixel electrode (not shown) connected thereto, and an opposed electrode (not shown) facing the pixel electrode.

When the thin film transistor array panel 300 according to the present exemplary embodiment is included in an organic light emitting device, an emission layer is positioned between the pixel electrode and an opposing electrode, thereby forming a light emitting diode (LED). That is, the pixel electrode functions as an anode and a common electrode functions as a cathode such that the emission layer disposed therebetween emits light according to an output current between the anode and the cathode, thereby displaying images.

When the thin film transistor array panel 300 according to the present exemplary embodiment is included in a liquid crystal display, the liquid crystal display may further include an opposing display panel (not shown) facing the thin film transistor array panel 300 and a liquid crystal layer (not shown) positioned between the two display panels. The pixel electrode and an opposing electrode may be positioned together in the thin film transistor array panel 300 or may be formed in other display panels. The pixel electrode and the opposing electrode generate an electric field to the liquid crystal layer to determine an alignment direction of the liquid crystal molecules, thereby controlling luminance of light passing through the liquid crystal layer.

The gate driver 400 is connected to the gate line of the thin film transistor array panel 300, and applies gate signals obtained by combining a gate-on voltage Von for turning on a switching element and a gate-off voltage Voff for turning off the switching element to the gate lines 121.

The gate driver 400 may be directly mounted on the thin film transistor array panel 300 in a form of at least one IC chip, and may be mounted on a FPC film and attached to the thin film transistor array panel 300 in the TCP type. Alternately, the gate driver 400 may be directly integrated on the thin film transistor array panel 300 along with the signal lines 121 and 171 and the thin film transistor. FIG. 3 shows an exemplary embodiment in which the gate driver 400 is integrated on the thin film transistor array panel 300, and the gate line 121 extends to be directly connected to the gate driver 400.

The data driving circuit 540 is connected to the data line 171 of the thin film transistor array panel 300 and applies the data voltage to the data line 171.

The data driving circuit 540 may be mounted on the thin film transistor array panel 300 in the shape of the IC chip. The data driving circuit 540 is connected to a contact assistant (not shown) connected to the end portion 179 of the data line 171, thereby transmitting the data voltage to the data line 171.

The display device according to an exemplary embodiment of the present invention may further include a driving voltage generator (not shown) generating the driving voltage and a PCB (not shown) including various circuit elements such as a signal controller (not shown) controlling the gate driver 400 and the data driving circuit 540. The PCB may be connected to the data driving circuit 540 through the FPC film.

Next, a structure of the pixel PX positioned in the display area DA and the end portion 179 of the data line 171 and the contact assistant will be described with reference to FIG. 4 and FIG. 5 as well as FIG. 3.

Figure 4:
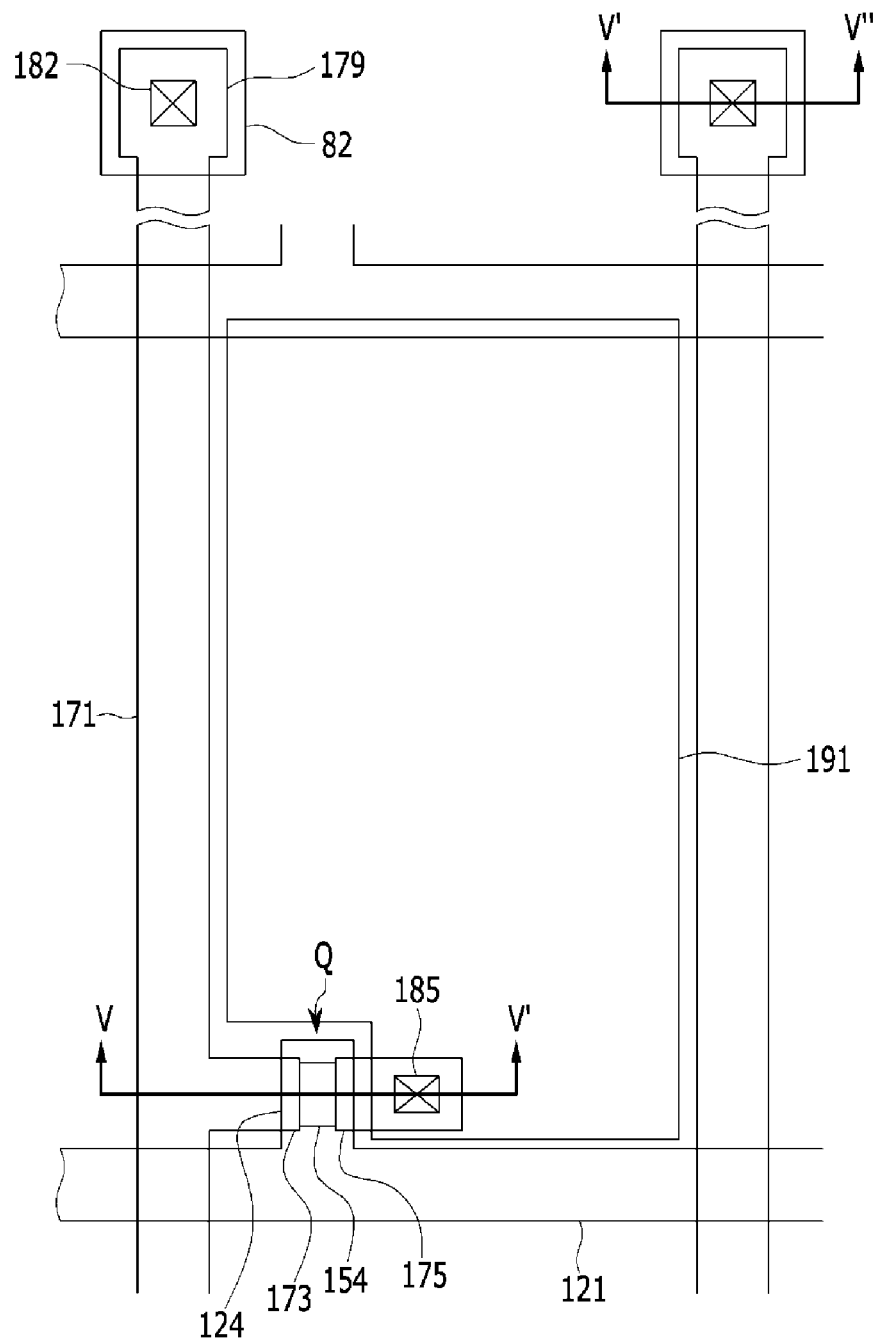
FIG. 4 is a layout view of one pixel of a thin film transistor array panel according to an exemplary embodiment of the present invention.
Figure 5:
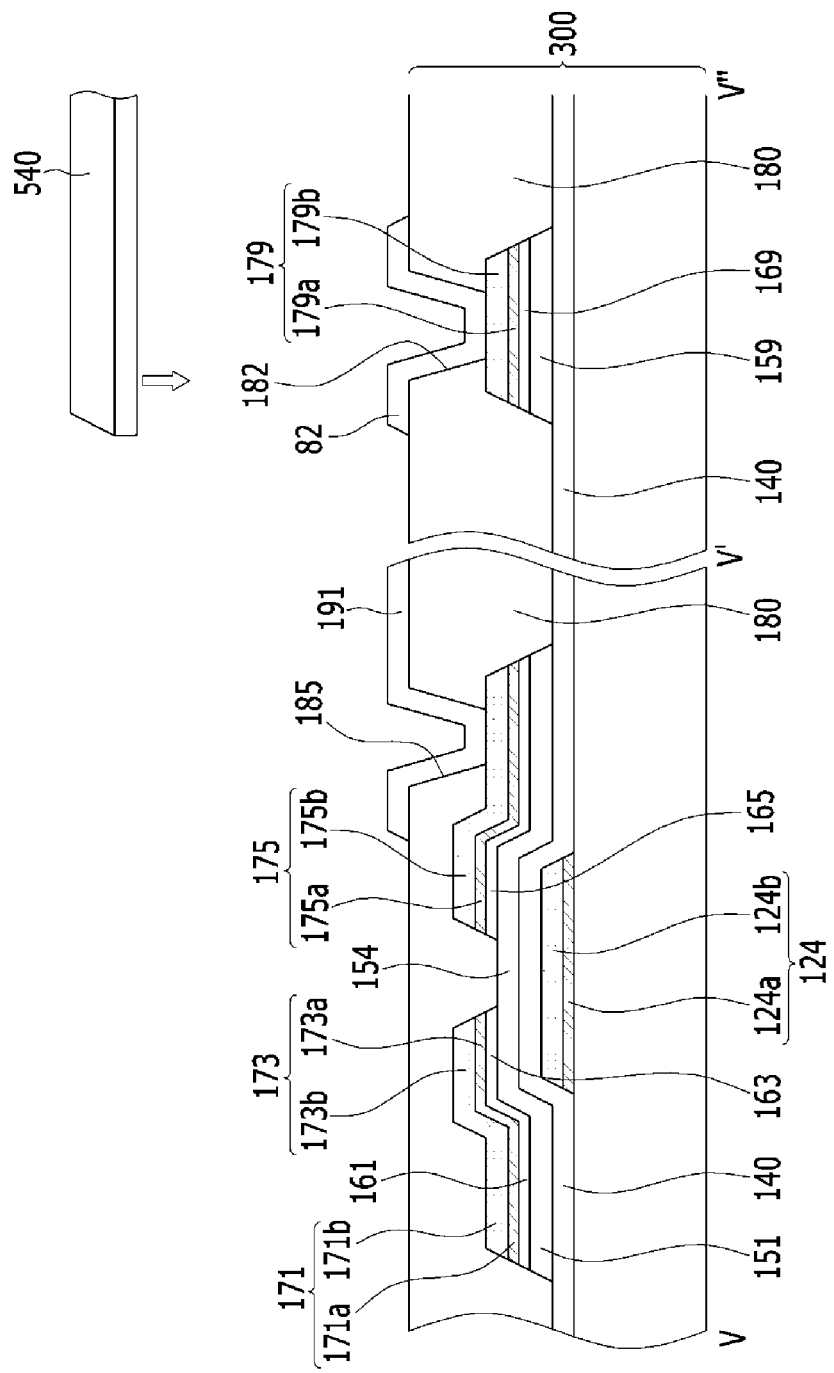
FIG. 5 is a cross-sectional view of the thin film transistor array panel of FIG. 4 taken along the line V-V'-V".

FIG. 4 is a layout view of one pixel of a thin film transistor array panel according to an exemplary embodiment of the present invention, and FIG. 5 is a cross-sectional view of the thin film transistor array panel of FIG. 4 taken along the line V-V'-V".

A thin film transistor array panel 300 according to the present exemplary embodiment includes a plurality of gate lines 121 that are formed on an insulation substrate 110 made of glass or plastic. Each of the gate lines 121 for transmitting the gate signal extend mainly in the row direction and include a plurality of gate electrodes 124 protruding upward and an end portion (not shown) for connecting to other layers or the gate driver 400.

The gate line 121 may be made of a dual-layer structure including a lower conductive layer 124a and an upper conductive layer 124b. In this case, the lower conductive layer 124a may include a material improving the adhesion between the upper conductive layer 124b and the insulation substrate 110, and the upper conductive layer 124b may include a conductive material having low resistance such as copper (Cu). However, the gate line 121 may be formed with a structure other than a single-layered structure or a triple-layered structure.

A gate insulating layer 140 that may be made of silicon nitride (SiNx) or silicon oxide (SiOx) is formed on the gate line 121.

A plurality of semiconductor stripes 151 are formed on the gate insulating layer 140. Each semiconductor stripe 151 extends mainly in the longitudinal direction and includes a plurality of protrusions 154 extending toward the gate electrodes 124 and an end portion 159.

A plurality of ohmic contact stripes 161 and ohmic contact islands 165 are formed on the semiconductor stripes 151. Each ohmic contact stripe 161 includes a plurality of protrusions 163 extending toward the protrusions 154 of the semiconductor stripe 151 and an end portion 169, and a protrusion 163 and an ohmic contact island 165 may be disposed as a pair on the protrusions 154 and face each other with respect to the gate electrode 124.

The ohmic contacts 161 and 165 may be made of a material such as n+ hydrogenated amorphous silicon in which an n-type impurity such as phosphorus (P) is doped with a high concentration, or may be made of silicide. However, the ohmic contacts 161 and 165 may be omitted according to the kind of semiconductor used for the semiconductor stripe 151.

A plurality of data lines 171 and a plurality of drain electrodes 175 are formed on the ohmic contacts 161 and 165.

The data lines 171 transmit the data voltage and extend mainly in the column direction thereby intersecting the gate lines 121. Each data line 171 includes a plurality of source electrodes 173 extending toward the gate electrodes 124 and an end portion 179 having a wide area for connection with the driver such as through the data driving circuit 540.

The drain electrode 175 is separated from the data line 171 and faces the source electrode 173 facing the gate electrode 124.

The data line 171 and the drain electrode 175 include lower conductive layers 171a, 173a, 175a, and 179a and upper conductive layers 171b, 173b, 175b, and 179b positioned thereon. However, the data lines 171 and the drain electrodes 175 may be formed with more than the single-layered structure or the triple-layered structure.

One gate electrode 124, one source electrode 173, and one drain electrode 175 form one thin film transistor (TFT) along with a protrusion 154 of a semiconductor 151, and a channel of the thin film transistor is formed in the protrusion 154 between the source electrode 173 and the drain electrode 175.

A passivation layer 180 is formed on the gate insulating layer 140, the data line 171, the drain electrode 175, and the exposed protrusions 154 of the semiconductor 151. The passivation layer 180 has a contact hole 185 exposing the drain electrode 175 and a contact hole 182 exposing the end portion 179 of the data line 171.

A plurality of pixel electrodes 191 and a plurality of contact assistants 82 are formed on the passivation layer 180. The pixel electrode 191 and the contact assistants 82 include IZO doped with a non-In and non-Zn metal oxide. The metal oxide doped to IZO includes at least one selected from $Ga_2O_3$, $Cr_2O_3$, MnO, $Ta_2O_5$, $SiO_2$, $TiO_2$, $ZrO_2$, BaO, $Li_2O$, $La_2O_3$, $Nd_2O_3$, BeO, $ThO_2$, $Y_2O_3$, CaO, $Sc_2O_3$, MgO, $Sm_2O_3$, $Al_2O_3$, $UO_2$, $B_2O_3$, $Na_2O$, and $Nb_2O_5$. These doped metal oxides may be the metal oxide having a smaller Gibbs free energy than zinc oxide (ZnO) and be thermodynamically stable compared with ZnO.

The pixel electrode 191 is physically and electrically connected to the drain electrode 175 through the contact hole 185, to thereby receive the data voltage from the drain electrode 175.

The contact assistants 82 are respectively electrically connected to the end portions 179 of the data lines 171 through the contact holes 182. The driver such as the data driving circuit 540 is attached to the contact assistants 82 as described above, to thereby transmit the data voltage to the data line 171.

The contact assistants 82 according to an exemplary embodiment of the present invention may improve the electrical connection between the end portion 179 of the data line 171 and the data driving circuit 540, and may protect them (i.e., from oxidation).

Next, a thin film transistor according to an exemplary embodiment of the present invention will be described with reference to FIG. 6. The same constituent elements as described above with respect to the exemplary embodiment shown in FIG. 3 using the same reference numbers and the same description is omitted.

Figure 6:
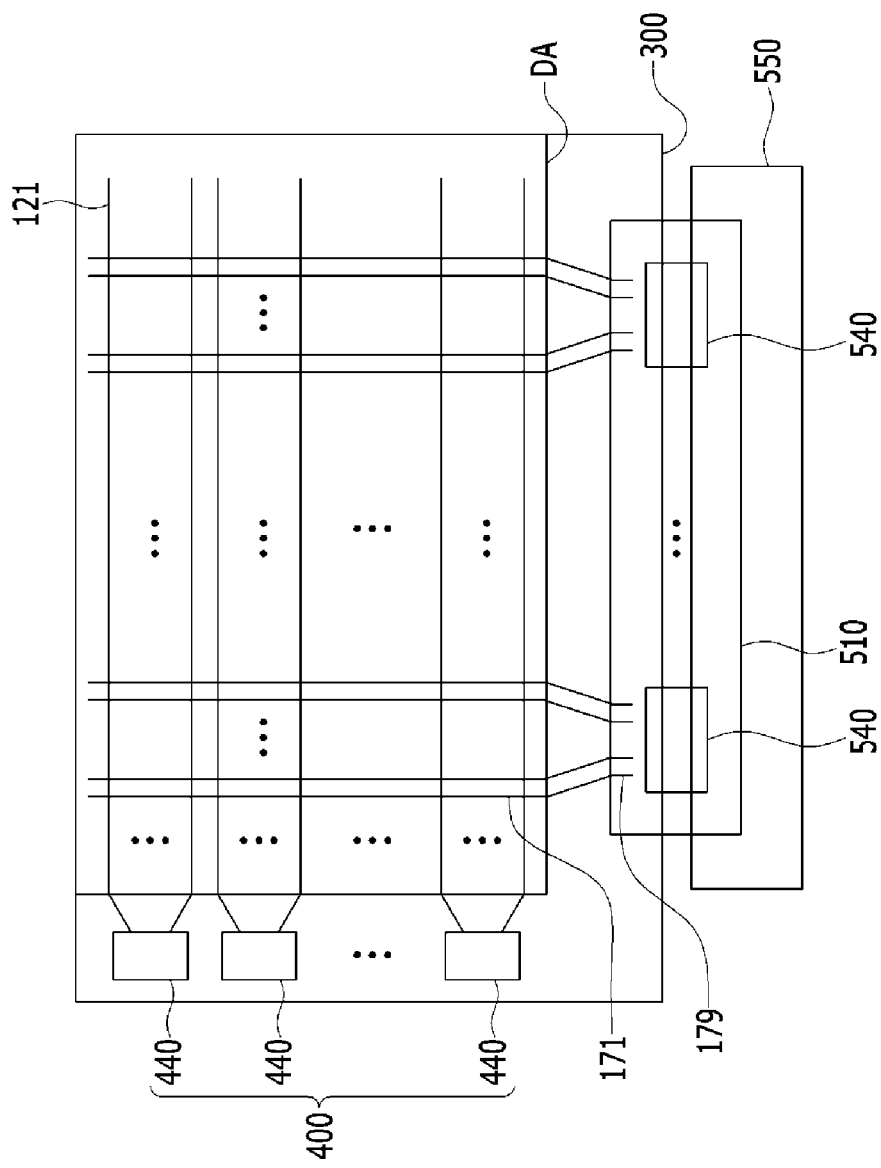
FIG. 6 is a layout view of a display device including a thin film transistor array panel according to an exemplary embodiment of the present invention.

FIG. 6 is a layout view of a display device of a thin film transistor array panel according to an exemplary embodiment of the present invention.

Referring to FIG. 6, the display device according to the present exemplary embodiment is substantially the same as the exemplary embodiment shown in FIG. 3 except for the structure of the gate driver 400 and the data driving circuit 540.

In the present exemplary embodiment, the gate driver 400 includes at least one gate driving circuit 440 mounted on the thin film transistor array panel 300. Each gate driving circuit 440 is connected to at least one gate line 121. The gate driving circuit 440 may be mounted on the thin film transistor array panel 300 in the shape of an IC chip. The gate driving circuit 440 is connected to contact assistants (not shown) connected to the end portions (not shown) of a plurality of gate lines 121, thereby transmitting the gate signal to the gate lines 121.

The data driving circuit 540 may be mounted on an FPC film 510. The FPC film 510 may include a plurality of data transmitting lines (not shown) connected to the data driving circuit 540, and each data transmitting line is connected to a contact assistant (not shown) connected to the data line 171 through the contact portion thereby transmitting the data signal from the data driving circuit 540 to the data line 171.

The display device according to the present exemplary embodiment may further include a PCB 550 including various circuit elements such as a signal controller (not shown) for controlling a driving voltage generator (not shown) to generate a driving voltage, the gate driver 400, and the data driving circuit 540. The PCB 550 may be electrically connected to the thin film transistor array panel 300 through the FPC film 510 and may transmit several driving signals and image data to the gate driving circuit 440 and the data driving circuit 540.

Alternatively, the data driving circuit 540 may be mounted on the PCB 550. In this case, the FPC film 510 may be omitted.

Next, the structure of the pixel PX positioned at the display area (DA), the end portions 129 and 179 of the gate line 121 and the data line 171, and the contact assistants will be described with reference to FIG. 7 and FIG. 8 as well as FIG. 6. The same constituent elements as described above with respect to the exemplary embodiment shown in FIG. 4 and FIG. 5 using the same reference numerals and the same description is omitted.

Figure 7:
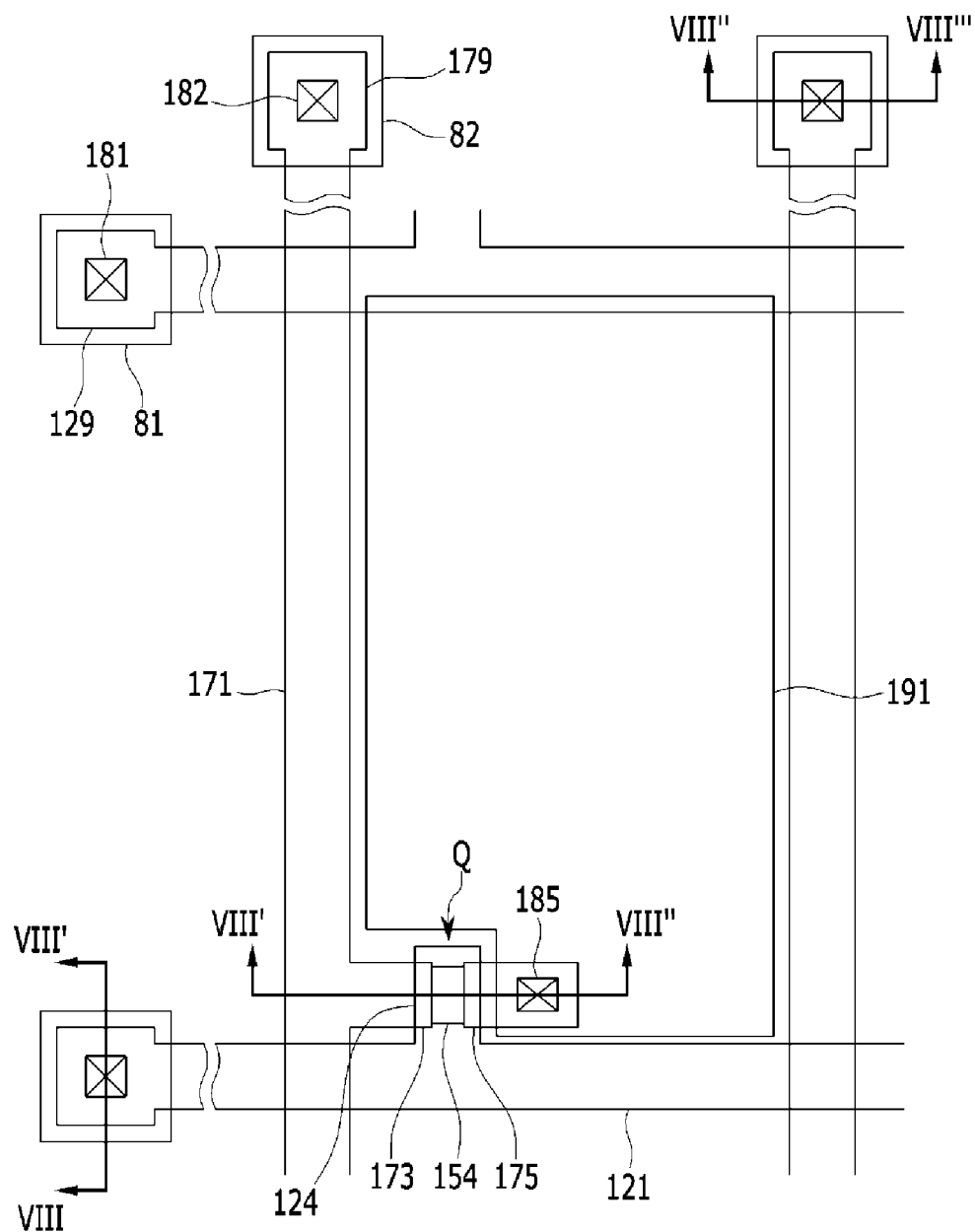
FIG. 7 is a layout view of one pixel of a thin film transistor array panel
Figure 8:
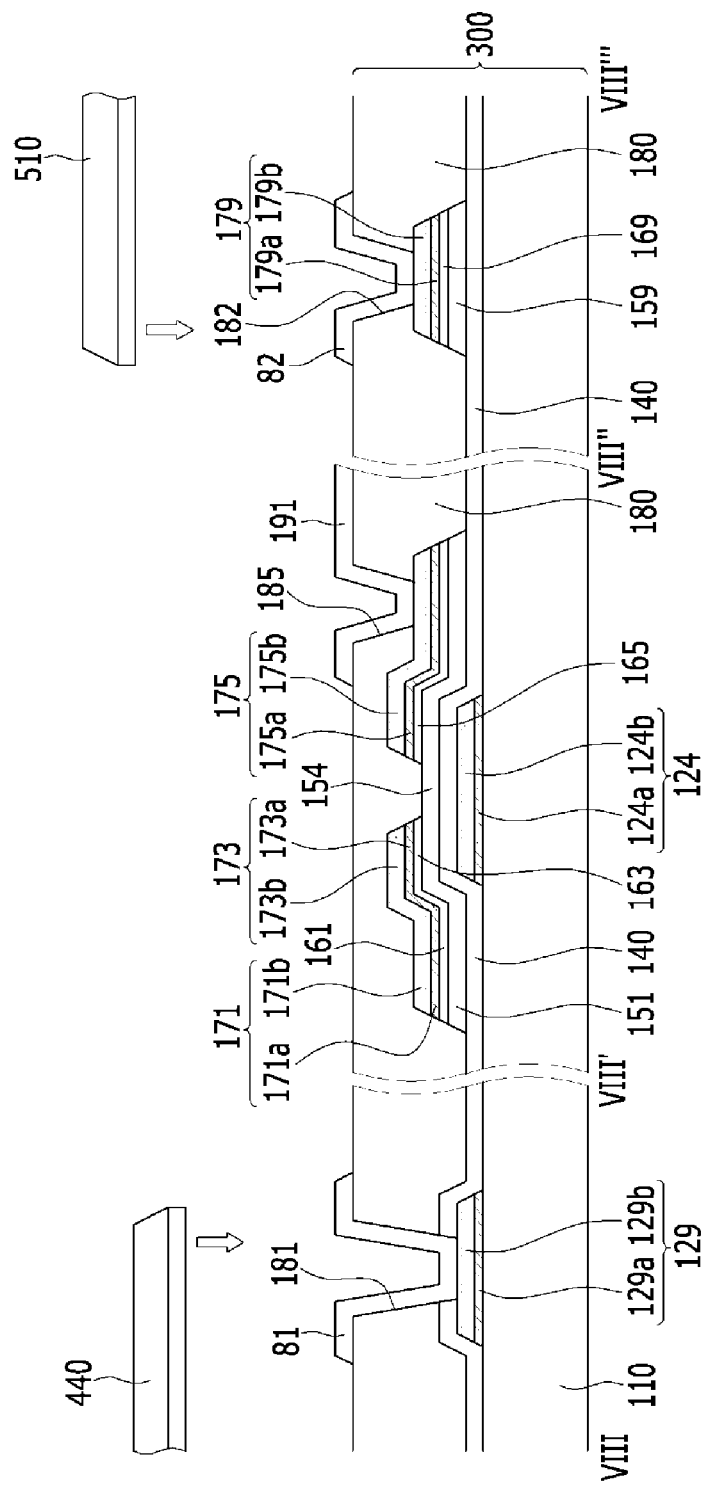
FIG. 8 is a cross-sectional view of the thin film transistor array panel of FIG. 7 taken along the line VIII-VIII'-VIII"VIII'''.

FIG. 7 is a layout view of one pixel of a thin film transistor array panel according to an exemplary embodiment of the present invention, and FIG. 8 is a cross-sectional view of the thin film transistor array panel of FIG. 7 taken along the line VIII-VIII'-VIII''-VIII'''.

A thin film transistor array panel 300 according to the present exemplary embodiment includes a plurality of gate lines 121 that are formed on an insulation substrate 110 made of glass or plastic. Each of the gate lines 121 for transmitting the gate signal extend mainly in the row direction, and include a plurality of gate electrodes 124 protruding upward and an end portion (not shown) having a wide area for connecting to other layers or the gate driver 440.

The gate line 121 may be made of a dual-layer structure including lower conductive layers 124a and 129a and upper conductive layers 124b and 129b. In this case, the lower conductive layer 124a and 129a may include a material improving the adhesion between the upper conductive layer 124b and 129b and the insulation substrate 110, and the upper conductive layer 124b and 129b may include a conductive material having low resistance such as copper (Cu). However, the gate lines 121 may be formed with a structure other than a single-layered structure or a triple-layered structure.

The gate insulating layer 140 is positioned on the gate line 121.

A plurality of semiconductor stripes 151 including a plurality of protrusions 154 and an end portion 159 are formed on the gate insulating layer 140. Alternatively, a semiconductor island (not shown) may only be formed on the gate electrode 124.

A plurality of ohmic contact stripes 161 and ohmic contact islands 165 are formed on the semiconductor stripes 151. Each ohmic contact stripe 161 includes a plurality of protrusions 163 extending toward the protrusions 154 of the semiconductor stripe 151 and an end portion 169, and a protrusion 163 and an ohmic contact island 165 may be disposed as a pair on the protrusions 154 and face each other with respect to the gate electrode 124.

A plurality of data lines 171 and a plurality of drain electrodes 175 are formed on the ohmic contacts 161 and 165.

Each data line 171 transmits the data voltage and extends mainly in the column direction thereby intersecting the gate line 121. Each data line 171 includes a plurality of source electrodes 173 extending toward the gate electrodes 124 and an end portion 179 having a wide area for connection with the driver such as the data driving circuit 540.

The drain electrode 175 is separated from the data line 171 and faces the source electrode 173 facing the gate electrode 124.

The data line 171 and the drain electrode 175 include lower conductive layers 171a, 173a, 175a, and 179a and upper conductive layers 171b, 173b, 175b, and 179b positioned thereon. However, the data lines 171 and the drain electrodes 175 may be formed with more than the single-layered structure or the triple-layered structure.

The gate electrode 124, the source electrode 173, and the drain electrode 175 form the thin film transistor Q along with the protrusions 154 of the semiconductor 151.

A passivation layer 180 is formed on the gate insulating layer 140, the data line 171, the drain electrode 175, and the exposed protrusions 154 of the semiconductor 151. The passivation layer 180 has a contact hole 185 exposing the drain electrode 175 and a contact hole 182 exposing the end portion 179 of the data line 171, and the passivation layer 180 and the gate insulating layer 140 have a contact hole 181 exposing the end portion 129 of the gate line 121.

A plurality of pixel electrodes 191 and a plurality of contact assistants 81 and 82 are formed on the passivation layer 180. The pixel electrode 191 and the contact assistants 82 include IZO doped with a non-In and non-Zn metal oxide. The metal oxide doped to IZO includes at least one of $Ga_2O_3$, $Cr_2O_3$, MnO, $Ta_2O_5$, $SiO_2$, $TiO_2$, $ZrO_2$, BaO, $Li_2O$, $La_2O_3$, $Nd_2O_3$, BeO, $ThO_2$, $Y_2O_3$, CaO, $Sc_2O_3$, MgO, $Sm_2O_3$, $Al_2O_3$, $UO_2$, $B_2O_3$, $Na_2O$, and $Nb_2O_5$. These doped metal oxides may have a smaller Gibbs free energy than ZnO and be thermodynamically stable compared with ZnO.

The pixel electrode 191 is physically and electrically connected to the drain electrode 175 through the contact hole 185, to thereby receive the data voltage from the drain electrode 175.

The contact assistants 81 and 82 are respectively electrically connected to the end portion 129 of the gate line 121 and the end portion 179 of the data line 171 through the contact holes 181 and 182. As described above, the gate driving circuit 440 is attached to the contact assistant 81 connected to the gate line 121 to thereby transmit the gate signal to the gate line 121. As described above, the FPC film 510 or the PCB (not shown) attached to the data driving circuit 540 is attached to the contact assistant 82 connected to the data line 171, to thereby transmit the data voltage to the data line 171.

The contact assistant 82 may improve the electrical connection between the end portion 179 of the data line 171 and the data driving circuit 540 and may protect them (e.g., from oxidation), and the contact assistant 81 may improve the electrical connection between the end portion 129 of the gate line 121 and the gate driving circuit 440 and may protect them (e.g., from oxidation).

Alternatively, the gate driving circuit 440 may also be mounted on the FPC film (not shown) or the PCB (not shown).

Further, the exemplary embodiments of the present invention described above may be applied in any type of display device in which signal lines are connected to other elements, such as circuits for supplying signals to the signal lines.

Although the pixel electrode and contact assistant are described above as being made of the same material and being on the same layer, neither is required according to the present invention. The pixel electrode and the contact assistant may be formed of different materials (e.g., the pixel electrode may be formed of ITO), and they can be formed on different layers.

According to exemplary embodiments of the present invention, contact resistance of a pad portion of a thin film transistor array panel may be reduced and manufacturing productivity may be increased by doping the pad portion including IZO with a metal oxide having smaller Gibbs free energy than zinc oxide.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A panel, comprising:
   a substrate;
   a signal line arranged on the substrate, the signal line configured to transmit a driving signal;
   an insulating layer arranged on the signal line; and
   a pixel electrode and a contact assistant arranged on the insulating layer,
   wherein the contact assistant is electrically connected to a portion of the signal line,
   wherein the contact assistant comprises a layer having an upper surface directly contacting a conductive film, the layer comprising indium zinc oxide (IZO) and a metal oxide,
   wherein the metal oxide has a smaller Gibbs free energy than zinc oxide (ZnO), and an amount of the metal oxide is less than an amount of the IZO of the contact assistant, and
   wherein the metal oxide is at least one selected from the group consisting of $Cr_2O_3$, MnO, $Ta_2O_5$, $ZrO_2$, BaO, $Li_2O$, $La_2O_3$, $Nd_2O_3$, BeO, $ThO_2$, CaO, MgO, $Sm_2O_3$, $UO_2$, $Na_2O$, and $Nb_2O_5$.

2. The panel of claim 1, wherein the signal line comprises at least one of a gate line configured to transmit a gate signal and a data line configured to transmit a data voltage.

3. The panel of claim 2, wherein the insulating layer comprises a contact hole exposing the portion of the signal line,
   wherein the contact assistant is electrically connected to the portion of the signal line through the contact hole, and
   wherein the portion of the signal line is a distal end of the signal line.

4. The panel of claim 3, wherein the conductive film is an anisotropic conductive film.

5. The panel of claim 3, wherein the contact assistant directly contacts the distal end portion of the signal line.

6. The panel of claim 4, wherein the pixel electrode and the contact assistant are arranged on the same layer and comprise the same material as each other.

7. The panel of claim 6, wherein the pixel electrode and the contact assistant comprise the metal oxide.

8. The panel of claim 7, wherein the pixel electrode and the contact assistant are arranged directly on the insulating layer.

9. A display device, comprising:
   a substrate;
   a signal line arranged on the substrate, the signal line configured to transmit a driving signal;
   an insulating layer arranged on the signal line;
   a pixel electrode and a contact assistant arranged on the insulating layer; and
   a driver contacting the contact assistant,
   wherein the contact assistant is electrically connected to a portion of the signal line,
   wherein the contact assistant comprises a layer having an upper surface directly contacting a conductive film, the layer comprising indium zinc oxide (IZO) as a host and a metal oxide as a dopant for the IZO,
   wherein the metal oxide has a smaller Gibbs free energy than zinc oxide (ZnO), and an amount of the metal oxide is less than an amount of the IZO of the contact assistant, and
   wherein the metal oxide is at least one selected from the group consisting of $Cr_2O_3$, MnO, $Ta_2O_5$, $ZrO_2$, BaO, $Li_2O$, $La_2O_3$, $Nd_2O_3$, BeO, $ThO_2$, CaO, MgO, $Sm_2O_3$, $UO_2$, $Na_2O$, and $Nb_2O_5$.

10. The display device of claim 9, wherein the signal line comprises at least one of a gate line configured to transmit a gate signal and a data line configured to transmit a data voltage.

11. The display device of claim 10, wherein the insulating layer comprises a contact hole exposing the portion of the signal line,
    wherein the contact assistant is electrically connected to the portion of the signal line through the contact hole, and
    wherein the portion of the signal line is a distal end of the signal line.

12. The display device of claim 11, wherein the conductive film is an anisotropic conductive film, and
    wherein the contact assistant and the driver are connected to each other via the anisotropic conductive film.

13. The display device of claim 11, wherein the contact assistant directly contacts the distal end portion of the signal line.

14. The display device of claim 12, wherein the pixel electrode and the contact assistant are arranged on the same layer and comprise the same material as each other.

15. The display device of claim 14, wherein the driver comprises an integrated circuit (IC) chip.

16. The display device of claim 14, wherein the driver comprises a flexible printed circuit film or a printed circuit board (PCB) mounted with an IC chip.

17. The display device of claim 14, wherein the pixel electrode and the contact assistant comprise the metal oxide.

18. The display device of claim 17, wherein the pixel electrode and the contact assistant are arranged directly on the insulating layer.

19. The display device of claim 9, wherein the signal line comprises at least one of a gate line configured to transmit a gate signal and a data line configured to transmit a data voltage.

20. The display device of claim 9, wherein the insulating layer comprises a contact hole exposing the portion of the signal line,
    wherein the contact assistant is electrically connected to the portion of the signal line through the contact hole, and
    wherein the portion of the signal line is a distal end of the signal line.

21. The display device of claim 9, wherein the conductive film is an anisotropic conductive film, and
    wherein the contact assistant and the driver are connected to each other via the anisotropic conductive film.

22. The display device of claim 9, wherein the pixel electrode and the contact assistant are arranged on the same layer and comprise the same material as each other.

23. The display device of claim 9, wherein the driver comprises an integrated circuit (IC) chip.

24. The display device of claim 9, wherein the driver comprises a flexible printed circuit film or a printed circuit board (PCB) mounted with an IC chip.

* * * * *